United States Patent
Sudharsanan et al.

(10) Patent No.: US 6,731,686 B1
(45) Date of Patent: May 4, 2004

(54) APPARATUS AND METHOD FOR PIPELINING VARIABLE LENGTH DECODE AND INVERSE QUANTIZATION OPERATIONS IN A HYBRID MOTION-COMPENSATED AND TRANSFORM CODED VIDEO DECODER

(75) Inventors: Subramania I. Sudharsanan, Union City, CA (US); Parthasarathy Sriram, San Jose, CA (US); Amit Gulati, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 678 days.

(21) Appl. No.: 09/584,834

(22) Filed: May 31, 2000

(51) Int. Cl.[7] ................................. H04B 1/66
(52) U.S. Cl. .............. 375/240.25; 375/240.26
(58) Field of Search ........... 375/240.01, 240.03, 375/240.23, 240.25, 240.26, 243; 708/402, 403; 341/67; H04B 1/66

(56) References Cited

U.S. PATENT DOCUMENTS 5,367,629 A * 11/1994 Chu et al. .................. 395/162
5,452,104 A * 9/1995 Lee .......................... 358/433
6,298,087 B1 * 10/2001 Luna et al. ............. 375/240.25

* cited by examiner

Primary Examiner—Tung T. Vo
(74) Attorney, Agent, or Firm—Morgan, Lewis & Bockius LLP (57) ABSTRACT

A method for pipelining variable length decode and inverse quantization operations in a hybrid motion-compensated and transform coded video decoder includes the step of mapping a new code word to a look-up table to retrieve a code word length, a zero-run length, and a quantized level. A new linear, zig-zagged position of a current coefficient is identified from the zero-run length and a previous zero-run length. The code word length is added to a current bitstream position to yield a new bitstream position. A quantization matrix coefficient from the new linear, zig-zagged position of the current coefficient is selected. The quantized level is multiplied by a predetermined value to produce a quantization product. In the case of inter block processing, a quantized level sign value is added to the quantization product. In the case of intra block processing, the quantization product does not include the quantization level sign. The quantization product is multiplied by a quantization matrix coefficient to form a derived quantization value. The derived quantization value is divided by a predetermined word length to produce a final quantization value. The new linear, zig-zagged position of the current coefficient is converted to a two-dimensional display position. The final quantization value is written at the display position.

20 Claims, 6 Drawing Sheets

APPARATUS AND METHOD FOR PIPELINING VARIABLE LENGTH DECODE AND INVERSE QUANTIZATION OPERATIONS IN A HYBRID MOTION-COMPENSATED AND TRANSFORM CODED VIDEO DECODER

BRIEF DESCRIPTION OF THE INVENTION

This invention relates generally to decoding hybrid motion-compensated and transform coded video signals. More particularly, this invention relates to a technique for pipelining variable length decode and inverse quantization operations in a hybrid motion-compensated and transform coded video decoder.

BACKGROUND OF THE INVENTION

Many video applications utilize data compression. More particularly, many video applications utilize transform code compressed domain formats, which include the Discrete Cosine Transform (DCT) format, the interframe predictive code format, such as the Motion Compensation (MC) algorithm, and hybrid compressed formats. The combination of Motion Compensation and Discrete Cosine Transform (MC-DCT) is used in a number of standards, including: MPEG-1, MPEG-2, MPEG-4, H.261, and H.263. The present invention is applicable to any hybrid motion-compensated and transform coded video stream, including MC-DCT.

Figure 1:
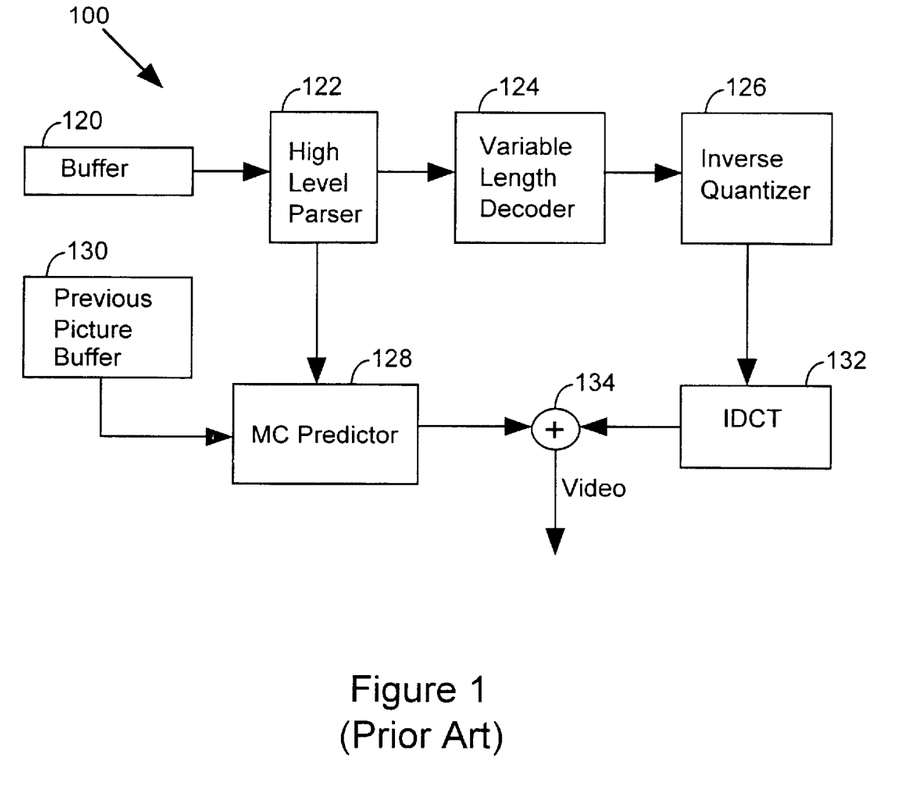
FIG. 1 illustrates a prior art hybrid motion-compensated and transform coded video decoder.

FIG. 1 illustrates a prior art hybrid motion-compensated and transform coded video decoder 100. The video decoder 100 includes a buffer 120 which delivers an input video stream to a high level parser 122, which extracts the motion related information and sends it to the Motion Compensated (MC) Predictor 128. The MC Predictor 128 also receives a previous picture frame from the previous picture buffer 130. The MC Predictor 128 uses known techniques to combine the previous picture frame with the motion related information to produce a current picture frame.

The high level parser 122 also applies its output to a Variable Length Decoder (VLD) 124, which produces quantized coefficients. The Inverse Quantizer (IQ) 126 takes its input from the VLD 124 to produce DCT coefficients, from which the Inverse Discrete Cosine Transform (IDCT) block 132 creates a displaced frame difference signal. An adder 134 is used to add the displaced frame difference signal and the output of the MC predictor 128 to produce a decoded video stream.

The variable length decoder 124 and the inverse quantizer 126 produce a processing bottleneck in prior art decoders. About 85 to 95 percent of the bits in a typical MPEG-2 bitstream represent the variable length code for quantized DCT coefficients. For high bitrate streams such as in DVD, or SDTV/HDTV broadcasts, the efficiency of the variable length decoder becomes crucial. In the case of HDTV, the inverse quantization rate is also relatively high since the picture resolution is high.

The design of efficient variable length decoders has been an active area of research. Inverse quantizers can usually be designed in a straightforward way, but are required to operate at the video pixel rates with additional checks for sparseness of the DCT coefficient blocks. The quantized DCT blocks are in general sparse (that is how the compression efficiency is achieved).

In view of the foregoing, it would be highly desirable to provide an improved technique for variable length decoding and inverse quantization in hybrid motion-compensated and transform coded video decoders. Ideally, the technique would facilitate at least some parallel decoding operations within the serial decoding process so the technique could be effectively implemented in software and in general purpose microprocessors.

SUMMARY OF THE INVENTION

The invention includes a method of pipelining variable length decode and inverse quantization operations in a hybrid motion-compensated and transform coded video decoder. The method includes the step of mapping a new code word to a look-up table to retrieve a code word length, a zero-run length, and a quantized level. A new linear, zig-zagged position of a current coefficient is identified from the zero-run length and a previous zero-run length. The code word length is added to a current bitstream position to yield a new bitstream position. A quantization matrix coefficient from the new linear, zig-zagged position of the current coefficient is selected. The quantized level is multiplied by a predetermined value to produce a quantization product. In the case of inter block processing, a quantized level sign value is added to the quantization product. In the case of intra block processing, the quantization product does not include the quantization level sign. The quantization product is multiplied by a quantization matrix coefficient to form a derived quantization value. The derived quantization value is divided by a predetermined word length to produce a final quantization value. The new linear, zig-zagged position of the current coefficient is converted to a two-dimensional display position. The final quantization value is written at the display position.

The invention also includes an apparatus to pipeline variable length decode and inverse quantization operations in a hybrid motion-compensated and transform coded video decoder. The apparatus includes a counter to identify a leading zero count in a variable length code. A multiplexer with multiplexer input nodes is configured to receive buffered look-up table segments and select nodes to receive the leading zero count. The multiplexer generates a multiplexer output signal. An adder adds the multiplexer output signal and an offset signal to yield a look-up table address. A look-up table returns a level signal, a length signal, and a run signal corresponding to the look-up table address.

The invention provides an improved technique for variable length decoding and inverse quantization in hybrid motion-compensated and transform coded video decoders. The technique facilitates parallel decoding within a serial processing stream. The reformulation of the decoding process through parallel processing facilitates the implementation of the invention in software and in general purpose microprocessors.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 2:
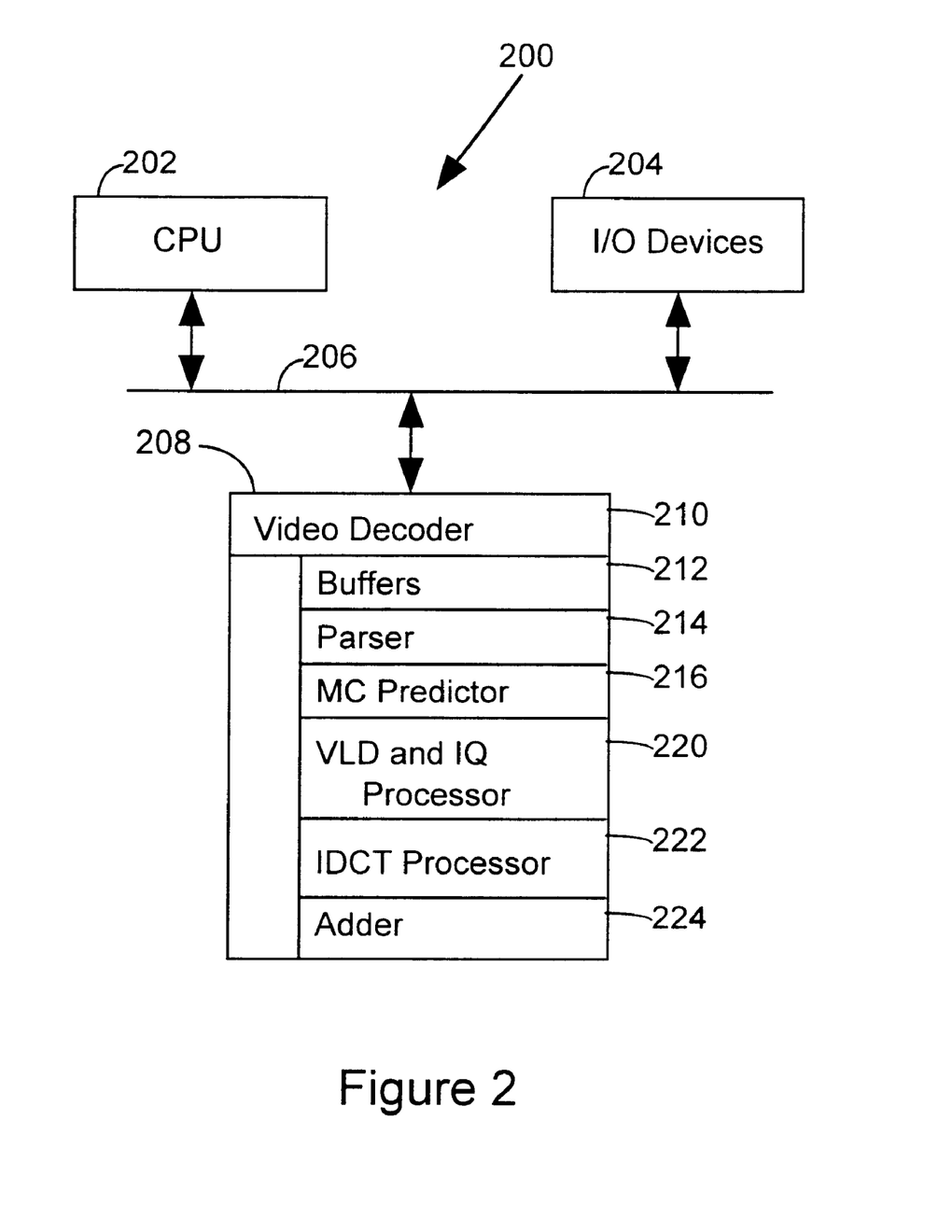
FIG. 2 illustrates a software-based variable length decode and inverse quantization processor forming a portion of a hybrid motion-compensated and transform coded video decoder according to an embodiment of the invention.

FIG. 2 illustrates a general purpose computer 200 used to implement an embodiment of the decoder of the invention. The computer 200 includes a central processing unit (CPU) 202 connected to a set of input/output (I/O) devices 204 via a bus 206. The input/output devices 204 include standard input devices, such as a keyboard and mouse, and standard output devices, such as a display, a printer, and the like. Also connected to the bus 206 is a memory 208. The memory 208 stores a set of executable programs forming a video decoder 210. The video decoder 210 includes a set of buffers 212 corresponding to the buffer 120 of FIG. 1, a parser 214 corresponding to the parser 122 of FIG. 1, an MC predictor 216 corresponding to the MC predictor 128 of FIG. 1, an IDCT processor 222 corresponding to the IDCT 132 of FIG. 1, and an adder 224 corresponding to the adder 134 of FIG. 1. Thus, the video decoder 210 includes a set of executable instructions to perform a number of known prior art functions. However, the video decoder 210 departs from the prior art in its use of a set of executable instructions to implement a combined variable length decoder and inverse quantizer processor 220. This processor 220 efficiently combines the prior art operations performed by separate variable length decoders 124 and inverse quantizers 126 of the type shown in FIG. 1.

By way of example, the invention is described in the context of an MPEG-2 hybrid motion-compensated and transform coded video decoder. However, as will be appreciated by those skilled in the art, the disclosed technique is equally applicable to other hybrid motion-compensated and transform coded video schemes.

After the high level parsing of the bitstream in accordance with prior art techniques, the processor 220 of the invention receives the bitstream, generally in a wide (e.g., 32-bit) register along with the offset (m) indicating the exact bit position. A bit field (e.g., 17 bits) and the size of the largest code word is extracted and a look-up table is used to find the corresponding zero run-length (z), the quantized level (x), and the length of the code (l). The inverse quantization is then carried out using the following formulae.

$$z_p = z_p + z$$

$$p = IZZ(z_p)$$

$$c(p) = \begin{cases} \dfrac{((2x + sgn\ x) \times Q_s \times Q_m((p)))}{32} & \text{If Inter} \\ (2x \times Q_s \times Q_m(p))/32 & \text{If Intra} \end{cases}$$

$$z_p = z_p + 1$$

$$\phi = \phi \oplus c(p)$$

$$m = m + 1$$

If $m > 32$, load new word from bitstream where $z_p$ is the zig-zagged position of the quantized coefficient, p is the linearized raster-scan order (within the 8×8 block) position which is obtained through an inverse zig-zag lookup, and c(p) is the dequantized coefficient. $Q_s$ is a quantization modulation factor used for all non-zero coefficients in the block and $Q_m(p)$ is the quantization matrix element corresponding to the position of the coefficient. The value $\phi$ is a running XOR average of the nonzero coefficients used for error control. Furthermore, the reconstruction equation is slightly different for the inter case (a block that uses past and/or present pictures) than the intra (independent block) case. It is also required to detect if the code word indicated the end of a block or an escape sequence.

Figure 3A:
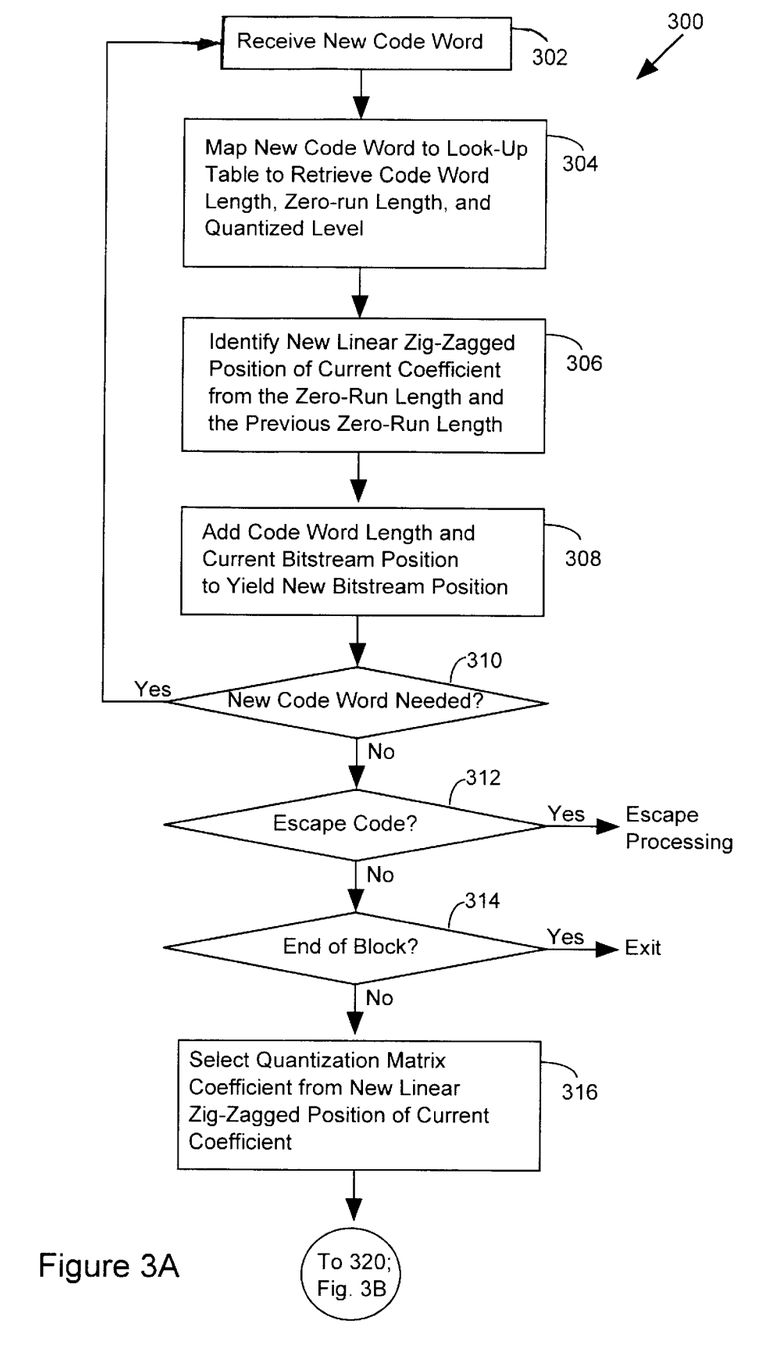
FIG. 3 illustrates processing steps associated with a software-based variable length decode and inverse quantization processor constructed in accordance with an embodiment of the invention.
Figure 3B:
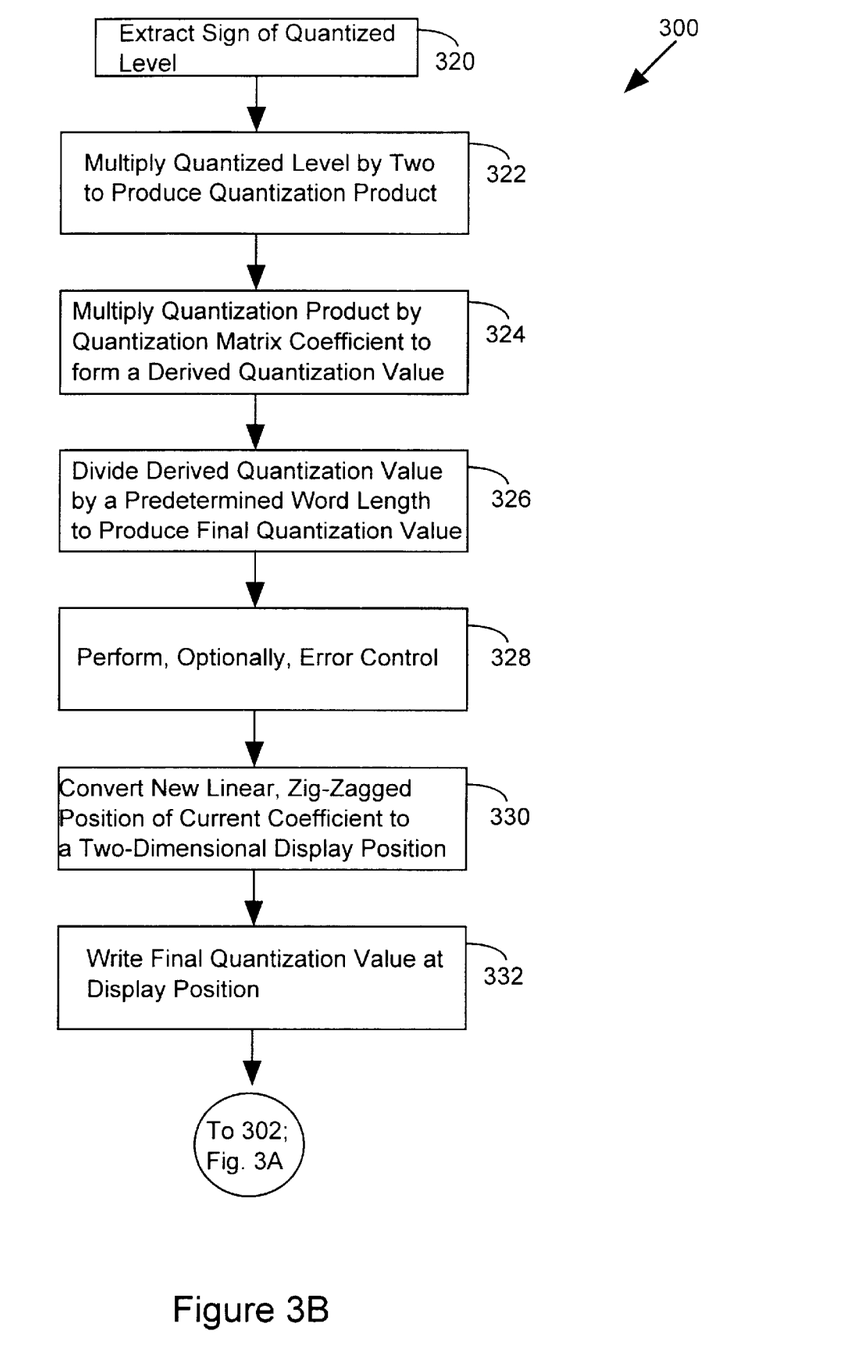

This processing is more fully appreciated with references to FIGS. 3A and 3B, which fully disclose a software implementation of the foregoing processing. The first operation shown in FIG. 3A is to receive a new code word (step 302). Next, the code word is mapped to a look-up table to retrieve the code word length, the zero-run length, and the quantized level (step 304). A new linear zig-zagged position of the current coefficient is then identified from the zero-run length and the previous zero run length (step 306). A code word length and the current bitstream position are then added to yield a new bitstream position (step 308).

At this point a decision is made to determine whether a new code word is needed (step 310). If so, a new code word is fetched (step 302); otherwise, a determination is made whether an escape code exists (step 312). If an escape code exists, then escape processing is performed; otherwise, a determination is made whether there is an end of block symbol (step 314). If there is an end of block symbol, then the process exits and a new block is processed, beginning at step 302. If an end of block symbol does not exist, processing continues at step 316.

As shown in FIG. 3A, a quantization matrix coefficient is selected from the new linear zig-zagged position of the current coefficient (step 316). Then, as shown in FIG. 3B, the sign of the quantized level is extracted (step 320). The quantized level is then multiplied by two to produce a quantization product (step 322). In the case of inter block processing, the sign of the quantized level is added to the product produced by multiplying the quantized level by two. Thus, in the case of inter block processing, the quantization product includes the sign of the quantization level. In the case of intra block processing, the quantization product does not include the quantization level sign.

The quantization product is multiplied by the quantization matrix coefficient to form a derived quantization value (step 324). The derived quantization value is divided by a predetermined word length (e.g., 32) to produce a final quantization value (step 326).

As shown at step 328, error control may be optionally performed at this point by accumulating a running logical XOR average of the final quantization value. The new linear, zig-zagged position of the current coefficient is then converted to a two-dimensional display position (step 330). Then, the final quantization value is written at the display position (step 332).

Similar procedures are used for all the other standards based video decoding, such as H.261, H.263, MPEG-1 and MPEG-4. This processing is repeated for every DCT coefficient for each block in the entire picture, for all pictures in the sequence.

Figure 4:
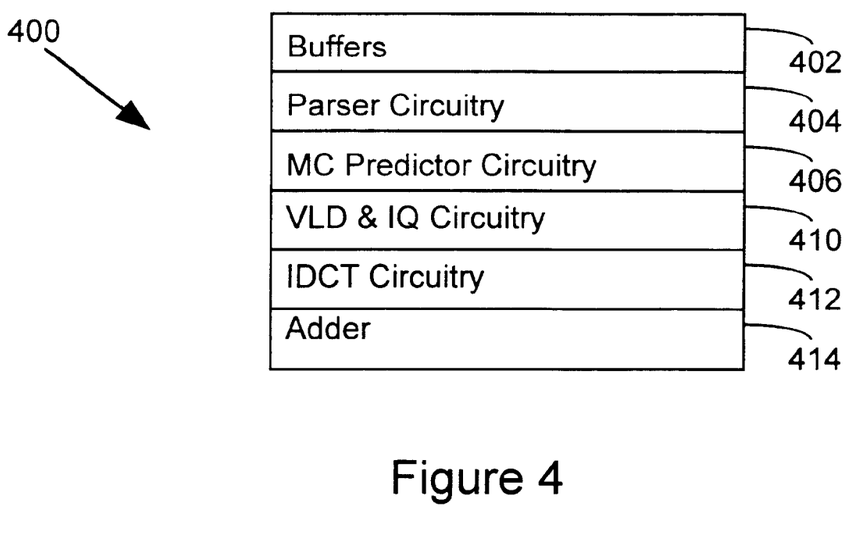
FIG. 4 illustrates a hardware-based variable length decode and inverse quantization processor forming a portion of a hybrid motion-compensated and transform coded video decoder constructed in accordance with an embodiment of the invention.

The foregoing processing can be parallelized and reduced to about four stages of a hardware implementation. FIG. 4 illustrates, in block diagram form, a hardwired circuit 400 that may be used to implement the decoder of the invention. The circuit 400 includes circuitry to implement prior art functions. In particular, the circuit 400 includes buffers 402, parser circuitry 404, MC predictor circuitry 406, IDCT circuitry 412, and an adder 414, each of which performs the correspondingly named function described in connection with FIG. 1. The circuit 400 also includes variable length decoding and inverse quantizing circuitry 410 in accordance with the invention. An embodiment of the VLD & IQ circuitry 410 is shown in FIG. 5.

Figure 5:
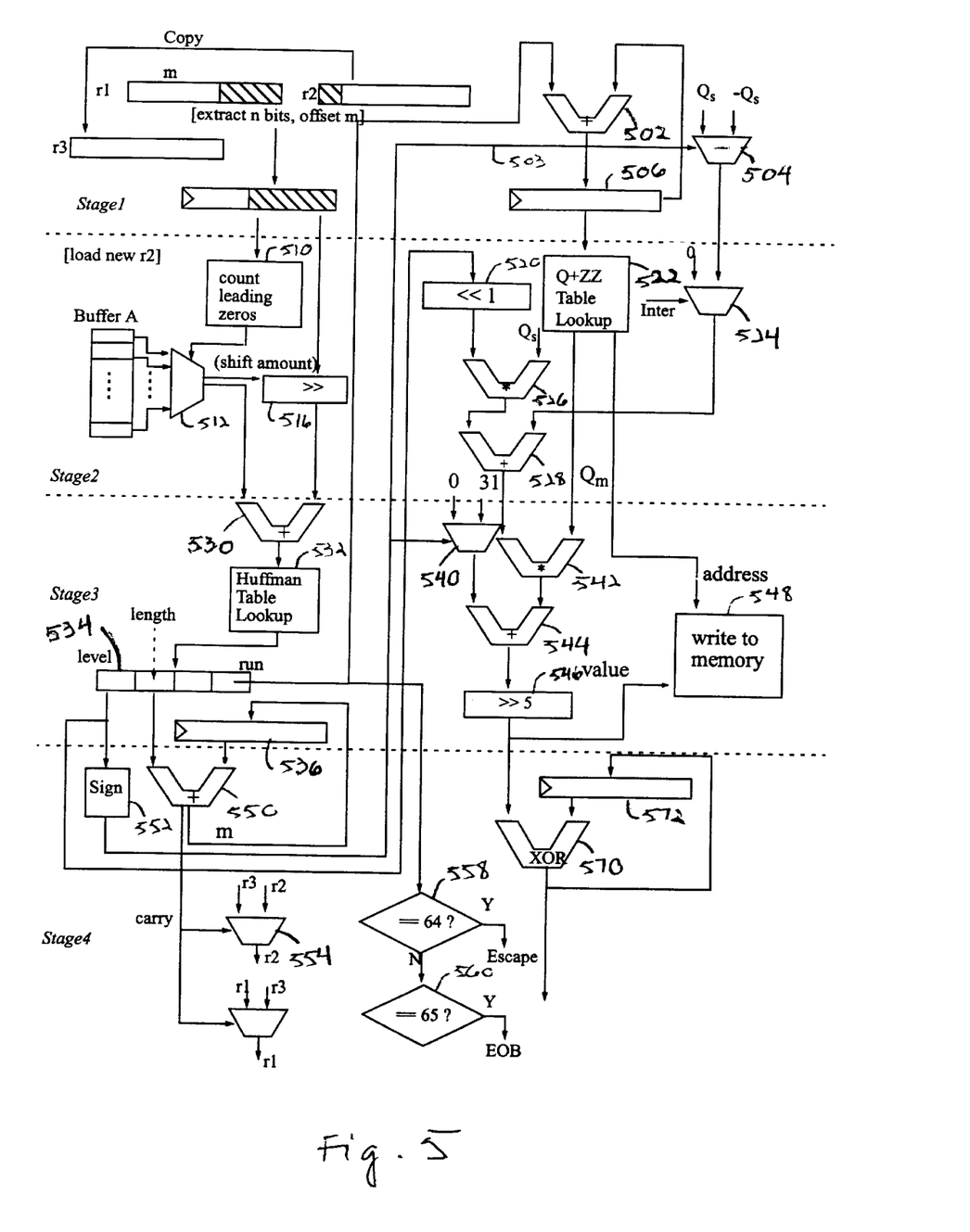
FIG. 5 is a schematic of a hardware-based variable length decode and inverse quantization processor constructed in accordance with an embodiment of the invention.

Initially, as shown on the left side of stage 1 of FIG. 5, a new code word is loaded into register r1. A preselected bit field width (e.g., 17-bits) with a given offset (m) is loaded into register r4. This processing corresponds to the step 302 of FIG. 3A.

The circuitry on the right side of stage 1 includes an adder 502, which receives a zero run length value from register 534 and the previous zero run length value stored in register 506. These values are added to identify the new linear zig-zagged position of the current coefficient. This operation corresponds to step 306 of FIG. 3A.

The stage 1 circuitry also includes a multiplexer 504. The output of the multiplexer 504 is either a positive quantization value or a negative quantization value, depending upon the select signal on line 503. The value of the select signal is based upon the quantized level signal sign, which may be identified by circuit 552. By way of example, circuit 552 may be implemented as a comparator to generate a digital high select signal for a positive sign represented by a digital high bit or a digital low select signal for a negative sign represented by a digital low bit. This processing corresponds to step 320 of FIG. 3B.

Attention now turns to the processing associated with stages 2 and 3. A 17-bit Huffman Table lookup 532 in stage 3 would be prohibitively expensive. The invention avoids such an architecture by exploiting the fact that the variable length codes (or Huffman codes) have a unique prefix property, meaning that two codes cannot share the exact same leading bit patterns. Thus, Huffman codes are implemented using many leading zeros or ones. In the case of MPEG and H.26x, it is generally leading zeros. Hence, using a counter that finds the leading number of zeros is extremely useful in reducing the look-up table size. In one embodiment, the table size is 428 words instead of $2^{17}$=13, 072 words. In other words, the look-up table stores a subset of a total look-up table expression. In this instance, the sub-set is approximately 1/30 of the total look-up table expression. This table size reduction reduces data cache misses. In hardware implementations, the required ROM or RAM size is reduced, resulting in size and cost benefits.

FIG. 5 illustrates a leading zero count circuit 510. The count signal generated by the circuit 510 is used as a select signal, which is applied to multiplexer 512. Input nodes of the multiplexer 512 are connected to buffered values pointing to "segments" of the look-up table. The select signal designates a corresponding segment, which is generated as a multiplexer output signal, which is applied to adder 530 and shift circuit 516. The shift circuit 516 shifts the offset m a predetermined number of bits corresponding to the multiplexer output signal to produce a shifted offset signal. The shifted offset signal from circuit 516 and the segment value from multiplexer 514 are added at adder 530 to produce a table address, which is applied to the Huffman Table Lookup 532. This operation corresponds to step 304 of FIG. 3A. The Huffman Table Lookup memory 532 generates a code word length signal, a zero-run length signal, and a quantized level signal, which are stored in register 534.

Returning to the second stage shown in FIG. 5, the zig-zagged position in register 506 is applied to a quantization matrix and zig-zag table lookup memory 522 to find the linearized, raster-scan order position of the coefficient and the corresponding quantization matrix element. This operation corresponds to step 316 of FIG. 3A. The position signal from memory 522 is applied as an address to memory 548. The quantization matrix element is applied to multiplier 542.

The other input to multiplier 542 is derived by processing the level signal with a left shift circuit 520, which left shifts the level signal by one bit position. The left shifted signal from circuit 520 is applied to multiplier 526, which also receives a quantization scale factor Qs. The output of multiplier 526 is applied to adder 528, which receives an output signal from multiplexer 524. The multiplexer 524 generates a signed quantization scale value from multiplexer 504 in the case of inter block processing. In the case of intra block processing, the multiplexer 524 generates a zero value output signal. This processing corresponds to step 322 of FIG. 3B.

The quantization product from the adder 528 is multiplied by the quantization matrix coefficient at multiplier 542 to produce a derived quantization value. This operation corresponds to step 324 of FIG. 3B.

The derived quantization value is then divided by a predetermined word length (e.g., 32). As shown in FIG. 5, this may be done as follows. Multiplexer 540 selects a zero value in the case of a positive quantized level signal. In the case of a negative quantized level signal, the multiplexer generates a digital signal with the value of 31, which is applied to adder 544. Adder 544 adds the value of 31 to the derived quantization value. The sum is then applied to shift circuit 546, which right shifts the sum. This results in a final quantization value C(p). This operation corresponds to step 326 of FIG. 3B. The final quantization value is then written to the memory 548 at the address specified from the inverse zig-zag look-up table 522. The value in memory 548 can then be written to a display. This operation corresponds to step 332 of FIG. 3B.

Stage 4 circuitry of FIG. 5 performs functions such as those shown at steps 310, 312, and 314 of FIG. 3A. As previously discussed, stage 4 includes a sign detector circuit 552 to determine the sign of the quantized level. Stage 4 also includes an adder 550 to add the word length signal with a previous value stored in register 536 to produce a new offset, m. If a carry is generated, i.e. m>32, then, the carry signal causes multiplexer 554 to load a new code word from register r2. This operation corresponds to step 302 of FIG. 3A. Note that the load latency is hidden by loading the new word in the first stage and using a mux to finally select the appropriate value.

Stage 4 circuitry also includes a comparator circuit 558 to determine if the zero-run length signal has a value of 64. If so, an escape sequence is invoked. This operation corresponds to step 312 of FIG. 3A. The zero-run length signal is also applied to a comparator circuit 560 to determine if the signal has a value of 65. If so, an end of block condition exists, and the next block is processed. The stage 4 circuitry also includes a logical exclusive-OR circuit 570 to combine a current final quantization value with a previous final quantization value stored in register 572. This running XOR value may be used for error control purposes. This operation corresponds to step 328 of FIG. 3B.

Those skilled in the art will recognize a number of benefits associated with the disclosed technology. The technique of the invention efficiently pipelines the variable length decode and inverse quantization operations in hybrid motion-compensated and transform coded video decoders. The pipelining created by the invention reduces the latency created by prior art variable length decoders and inverse quantizers. The technique of the invention eliminates the need for some zero element checking performed in prior art inverse quantization units. The techniques of the invention facilitate a relatively small table lookup memory. The pipeline produced by the invention transforms the highly serial variable length decode and inverse quantization processes into parallel components that may be implemented in either superscalar or VLIW architectures. Analyses of an embodiment of the invention demonstrate that only about 18 cycles are needed to decode and inverse quantize a symbol. These results were achieved using various pipelining techniques. For example, when the variable-length decoding is performed for the current field, the inverse quantization and error control may be performed for a previously decoded sample, and so on. Using the example of 18 cycles, at about 4 bit/symbol, a 20 Mbit/s HDTV video stream can be processed in only 90 million cycles a second, which is a comfortable fraction of the processing power of modern microprocessors.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for pipelining variable length decode and inverse quantization operations in a hybrid motion-compensated and transform coded video decoder, said method comprising the steps of:
    mapping a new code word to a look-up table to retrieve a code word length, a zero-run length, and a quantized level;
    identifying a new linear, zig-zagged position of a current coefficient from said zero-run length and a previous zero-run length;
    adding said code word length and a current bitstream position to Yield a new bitstream position;
    identifying when a run length escape code exists; and
    selectively performing escape processing in response to said identifying step.

2. The method of claim 1, further comprising the steps of:
    determining when a new code word is required; and
    selectively retrieving a new code word in response to said determining step.

3. The method of claim 1, further comprising the step of selecting a quantization matrix coefficient from said new linear, zig-zagged position of said current coefficient.

4. A method for pipelining variable length decode and inverse quantization operations in a hybrid motion-compensated and transform coded video decoder, said method comprising the steps of:
    mapping a new code word to a look-up table to retrieve a code word length, a zero-run length, and a quantized level;
    identifying a new linear, zig-zagged position of a current coefficient from said zero-run length and a previous zero-run length;
    adding said code word length and a current bitstream position to yield a new bitstream position;
    locating an end of block code; and
    terminating processing in response to said locating step.

5. The method of claim 4, further comprising the steps of:
    determining when a new code word is required; and
    selectively retrieving a new code word in response to said determining step.

6. The method of claim 4, further comprising the step of selecting a quantization matrix coefficient from said new linear, zig-zagged position of said current coefficient.

7. A method for pipelining variable length decode and inverse quantization operations in a hybrid motion-compensated and transform coded video decoder, said method comprising the steps of:
    mapping a new code word to a look-up table to retrieve a code word length, a zero-run length, and a quantized level;
    identifying a new linear, zig-zagged position of a current coefficient from said zero-run length and a previous zero-run length;
    adding said code word length and a current bitstream position to yield a new bitstream position;
    determining a sign value for said quantized level;
    multiplying said quantized level by a predetermined value to produce a quantization product; and
    adding, in the case of inter block processing, said sign value to said quantization product.

8. The method of claim 7 further comprising the step of multiplying said quantization product by a quantization matrix coefficient to from a derived quantization value.

9. The method of claim 8 further comprising the step of dividing said derived quantization value by a predetermined word length to produce a final quantization value.

10. The method of claim 9 further comprising the step of converting said new linear, zig-zagged position of said current coefficient to a two-dimensional display position.

11. The method of claim 10 further comprising the step of writing said final quantization value at said display position.

12. An apparatus to pipeline variable length decode and inverse quantization operations in a hybrid motion-compensated and transform coded video decoder, comprising:
    a counter to identify a leading bit count in a variable length code;
    a multiplexer with multiplexer input nodes configured to receive buffered look-up table segments and select nodes to receive said leading bit count, said multiplexer generating a multiplexer output signal;
    an adder to add said multiplexer output signal and an offset signal to yield a look-up table address; and
    a look-up table to return a level signal, a length signal, and a run signal corresponding to said look-up table address.

13. The apparatus of claim 12 further comprising:

a register to store an offset value; and a shift circuit to right shift said offset value an amount specified by said multiplexer output signal and thereby produce said offset signal.

14. The apparatus of claim 12 further comprising:

a shift circuit to left shift said level signal one bit position to produce a shifted level signal; and a multiplier to multiply said shifted level signal and a quantization scale factor.

15. The apparatus of claim 12 further comprising an adder to add said length signal with a previous offset value to produce a new offset value.

16. The apparatus of claim 15 wherein said adder produces a carry signal.

17. The apparatus of claim 16 further comprising a new word multiplexer with a select signal node responsive to said carry signal to load a new word.

18. The apparatus of claim 12 farther comprising a bit count circuit to produce an escape signal when said run signal corresponds to a predetermined value.

19. The apparatus of claim 12 further comprising a bit count circuit to produce an end-of-block signal when said run signal corresponds to a predetermined value.

20. The apparatus of claim 12 wherein said look-up table stores a subset of a total look-up table expression, said subset being facilitated by said leading bit count from said counter.

* * * * *